(12) United States Patent
Mukherjee et al.

(10) Patent No.: US 6,611,163 B1
(45) Date of Patent: Aug. 26, 2003

(54) SWITCHED CAPACITOR SCHEME FOR OFFSET COMPENSATED COMPARATORS

(75) Inventors: Subhashish Mukherjee, Bangalore (IN); Sourja Ray, Mumbai (IN); Sumeet Mathur, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/102,291

(22) Filed: Mar. 20, 2002

(51) Int. Cl.[7] .................................................. G06G 7/64
(52) U.S. Cl. .......................................... 327/337; 327/91
(58) Field of Search ................................ 327/337, 554, 327/77, 65, 94, 96, 91, 307, 362; 330/9, 51; 341/172

(56) References Cited

U.S. PATENT DOCUMENTS

| | | | | |
|---|---|---|---|---|
| 5,142,238 A | * | 8/1992 | White | 330/9 |
| 5,963,156 A | * | 10/1999 | Lewicki et al. | 327/94 |
| 6,031,480 A | * | 2/2000 | Soenen et al. | 330/9 |
| 6,169,427 B1 | * | 1/2001 | Brandt | 327/94 |

* cited by examiner

Primary Examiner—Toan Tran
(74) Attorney, Agent, or Firm—Alan K. Stewart; W. James Brady, III; Frederick J. Telecky, Jr.

(57) ABSTRACT

An offset compensated comparator 70 has capacitors 80 and 81 coupled directly between the inputs of a preamplifier 78 and the outputs of a previous stage amplifier 62. The comparator 70 also includes additional capacitors 82 and 83 coupled between the inputs of the preamplifier 78 and reference voltage nodes $V_{REFP}$ and $V_{REFM}$. Switches 73 and 74 are coupled between the additional capacitors 82 and 83 and the reference voltage nodes $V_{REFP}$ and $V_{REFM}$. An additional switch 72 is coupled between the additional capacitors 82 and 83. In this configuration, there are no series sampling switches between the previous stage amplifier 62 and the comparator 70. Eliminating the series switches reduces the load seen by the previous stage amplifier 62, which allows the previous stage amplifier 62 to have a faster settling time. This allows the current in the previous stage amplifier 62 to be decreased which reduces the power consumption.

17 Claims, 3 Drawing Sheets

SWITCHED CAPACITOR SCHEME FOR OFFSET COMPENSATED COMPARATORS

FIELD OF THE INVENTION

This invention generally relates to electronic systems and in particular it relates to a switched capacitor scheme for offset compensated comparators.

BACKGROUND OF THE INVENTION

For pipelined analog-to-digital converter (ADC) designs, offset compensated comparators are often used in the pipeline stages. This is especially true for multi-bit ADCs where the comparator offset needs to be tightly controlled. The usual scheme is to connect these comparators to the driving (previous stage) amplifier through series switches. These switches are opened periodically to isolate the comparators. During this time the comparator inputs are shorted and the offset cancellation phase takes place. If the pre-amplifier in the comparator is configured in unity gain feedback, the offset is stored in the series capacitors connected at the input of the pre-amplifier. This is called input offset correction. If the inputs of the pre-amplifier are shorted, the offset is stored in the series capacitors connected at the output of the pre-amplifier in the comparator. This is called output offset correction.

A typical prior art offset compensated comparator 20 connected to a driving (previous stage) amplifier 22 through series switches 24 and 25 is shown in FIG. 1. The offset compensated comparator 20 includes switches 24–29; comparator preamplifier 30; capacitors 32 and 34; parasitic capacitances 36 and 38; latch 40; inputs $V_{INP}$ and $V_{INM}$; reference voltages $V_{REFP}$ and $V_{REFM}$; latched bit 42; and latch enable 44. The previous stage amplifier 22 includes switches 50–60; amplifier 62; and capacitors 64–67.

For the prior art scheme shown in FIG. 1, the voltage at the input of pre-amplifier 30 is given by:

$$V_{Pre-INP} - V_{Pre-INM} = \frac{C_S}{C_S + C_P}[(V_{INP} - V_{INM}) - (V_{REFP} - V_{REFM})] \quad \text{Eq. 1}$$

Where $V_{pre-INP}$ is the voltage at node N1; $V_{Pre-INM}$ is the voltage at node N2; $C_S$ is the capacitance of capacitors 32 and 34; and $C_P$ is the parasitic capacitances 36 and 38 at the input of preamplifier 30. The input to the latch 40 is the input of preamplifier 30 multiplied by the gain of preamplifier 30. Assuming that the offset of preamplifier 30 is completely removed by this scheme, the overall offset of the comparator 20 is then $$OFFSET = \frac{OFFSET_{LATCH}}{GAIN_{Pre-Amp} \times \frac{C_S}{C_S + C_P}}$$

Where $OFFSET_{LATCH}$ is the offset of latch 40, and $GAIN_{Pre-amp}$ is the gain of preamplifier 30.

The series switches 24 and 25 load the driving amplifier 22 and slow it down. For very high speed ADCs (>40 MSPS), this effect is fairly pronounced. Each of the switches 24 and 25 IS typically a CMOS switch that can be modeled as an R-C load having resistance $R_{SW}$ and Parasitic capacitances $C_{P1}$ and $C_{P2}$, as shown in FIG. 2. Also the series resistance $R_{SW}$ of the switches 24 and cause an additional delay from the output of the driving amplifier 22 to the sampling capacitors 32 and 34. This results in an additional offset in the comparator due to incomplete settling of the voltage waveforms across these sampling capacitors.

To decrease the loading effect, the switch resistance $R_{SW}$ cannot be reduced arbitrarily by increasing the switch size as this also increases the parasitic capacitances $C_{P1}$ and $C_{P2}$ at he drain and source nodes. Another option is to boost the gate drive of the switch, but this adds to the implementation complexity in the design of high speed ADCs.

SUMMARY OF THE INVENTION

An offset compensated comparator has capacitors coupled directly between the inputs of a preamplifier and the outputs of a previous stage amplifier. The comparator also includes additional capacitors coupled between the inputs of the preamplifier and reference voltage nodes. Switches are coupled between the additional capacitors and the reference voltage nodes. An additional switch is coupled between the additional capacitors. In this configuration, there are no series sampling switches between the previous stage amplifier and the comparator. Eliminating the series switches reduces the load seen by the previous stage amplifier, which allows the previous stage amplifier to have a faster settling time. This allows the current in the previous stage amplifier to be decreased which reduces the power consumption.

DETAILED DESCRIPTION OF PREFERRED EMBODIMENTS

Figure 1:
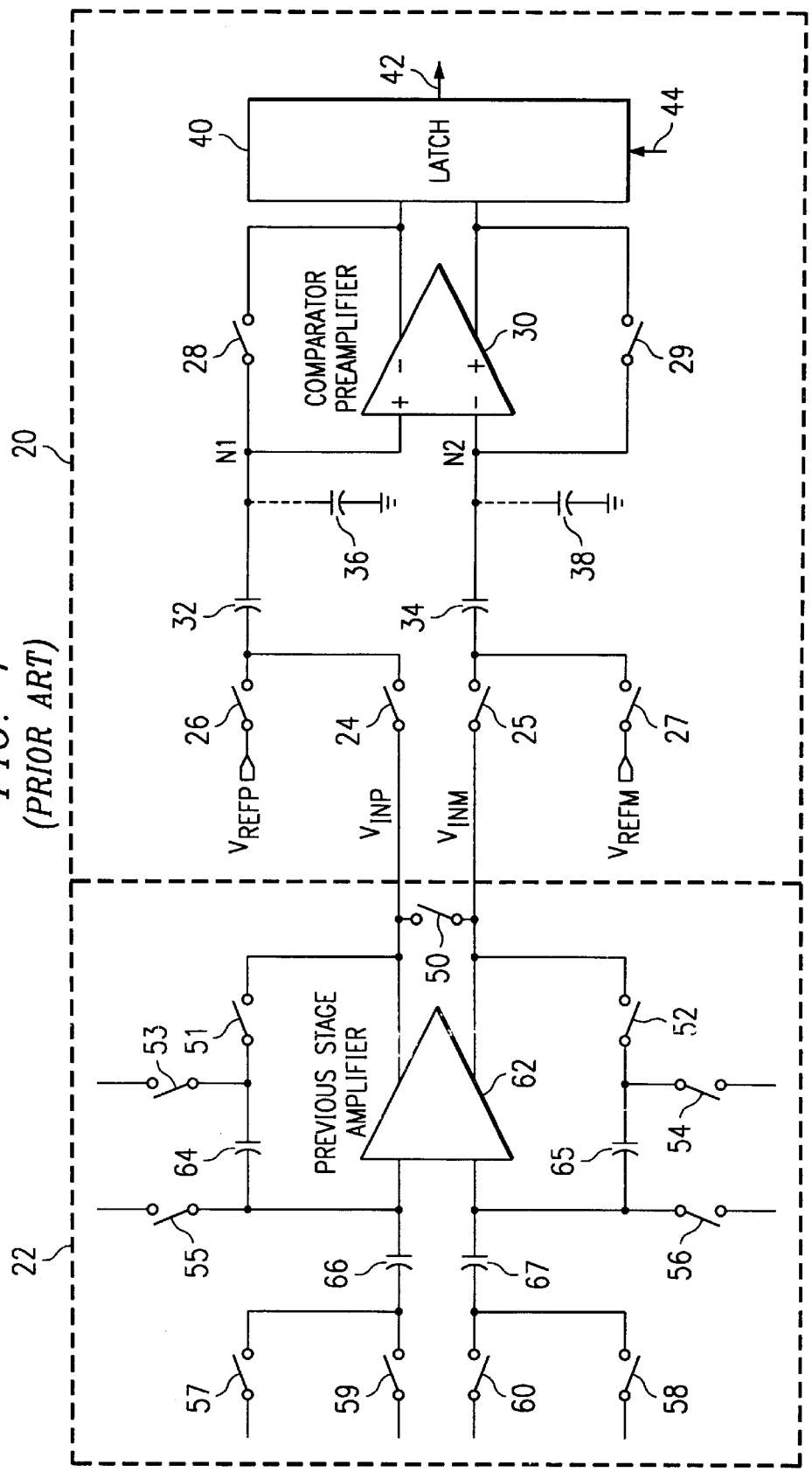
FIG. 1 is a schematic circuit diagram of a prior art offset compensated comparator.
Figure 2:
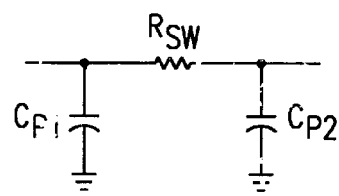
FIG. 2 is a schematic circuit diagram of an R-C load model for the switches of FIG. 1.
Figure 3:
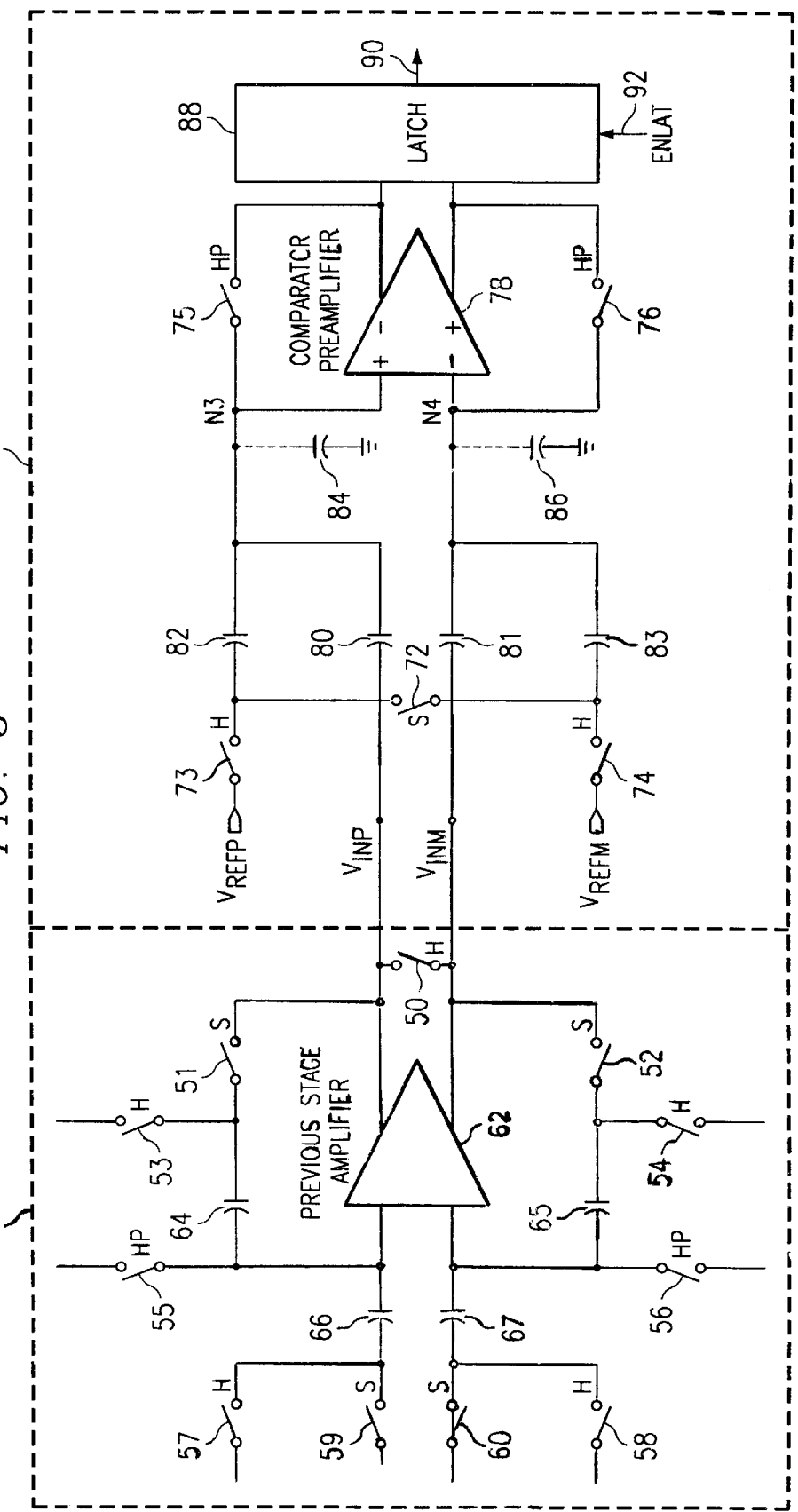
FIG. 3 is a schematic circuit diagram of a preferred embodiment offset compensated comparator without series switches at the input.

A preferred embodiment offset compensated comparator 70 connected to a driving (previous stage) amplifier 22 is shown in FIG. 3. The preferred embodiment comparator 70 includes switches 72–76; comparator preamplifier 78; capacitors 80–83; parasitic capacitances 84 and 86; latch 88; inputs $V_{INP}$ and $V_{INM}$; reference voltages $V_{REFP}$ and $V_{REFM}$; latched bit 90; and latch enable 92. The previous stage amplifier 22 is the same as shown in FIG. 1. The embodiment of FIG. 3 removes the series sampling switches 24 and 25 of the prior art comparator. Eliminating the series switches 24 and 25 reduces the load seen by the previous stage amplifier 22 which allows the previous stage amplifier 22 to have a faster settling time. For a given time for the output of amplifier 22 to settle to a given accuracy, the current in amplifier 22 can be decreased which reduces the power consumption.

Figure 4:
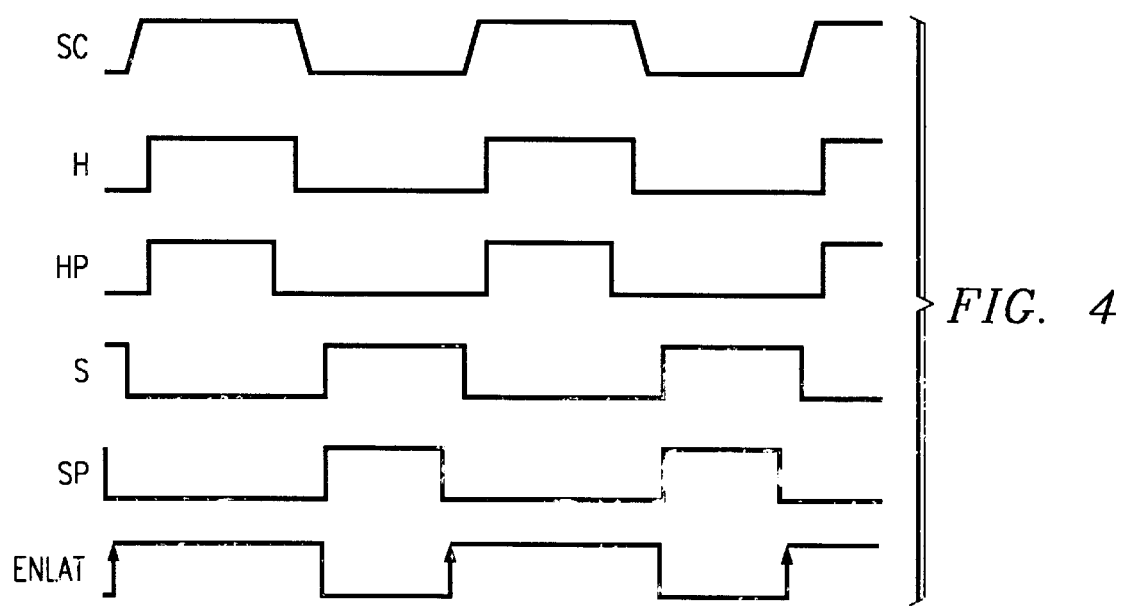
FIG. 4 is a timing diagram for the circuit of FIG. 3.

A timing diagram for the circuit of FIG. 3 is shown in FIG. 4. The timing diagram includes system clock SC; switching signals H, HP, S, and SP; and latch enable signal ENLAT. The switching signals H, HP, S, and SP, and latch enable signal ENLAT are shown in FIG. 3.

During the time the previous stage 22 is sampling (sample phase for the previous stage and hold phase for the current stage) the output of the previous stage amplifier 62 does not track the inputs of the previous stage. Hence the outputs of amplifier 62 can be shorted together by switch 50. At the same time, the comparator preamplifier 78 is set in unity gain configuration by switches 75 and 76. Thus, the input referred offset is stored at the preamplifier input nodes N3 and N4.

In the prior art technique of FIG. 1, the inputs of comparator 20 are isolated from the output of previous stage 22 by opening the sampling switches 24 and 25. However, in this phase, the differential output voltage of amplifier 22 is nullified by switch 50. This allows the sampling switches to be removed in the preferred embodiment. Since a zero signal is being sampled on the capacitors 80 and 81 during this phase, the comparison equations can still be met by appropriately modifying the sampling network as shown in FIG. 3. The only assumption made is that the output-shorting switch 50 of the driving amplifier 22 completely nullifies the differential output of amplifier 62. Any residual voltage will have to be absorbed by comparator 70 as additional offset.

The voltage at the input of preamplifier 78 and the offset is given by:

$$V_{Pre-INP} - V_{Pre-INM} = \frac{C_S}{2C_S + C_P}[(V_{INP} - V_{INM}) - (V_{REFP} - V_{REFM})]$$

$$OFFSET = \frac{OFFSET_{LATCH}}{GAIN_{Pre-Amp} \times \frac{C_S}{2C_S + C_P}}$$

Eq. 2

Where $V_{Pre-INP}$ is the voltage at node N3; $V_{Pre-INM}$ is the voltage at node N4; $C_S$ is the capacitance of capacitors 80–83; and $C_P$ is the parasitic capacitances 84 and 86 at the input of preamplifier 78.

Comparing the prior art scheme [Eq. 1] with the preferred embodiment scheme [Eq. 2], it can be seen that the gain of the switched capacitor stage has effectively halved. Thus the overall comparator offset (after preamplifier offset cancellation) doubles, which is seen from the offset equation. But this is usually not an issue and the required specifications are met.

In case the specifications are not met the following means can be adopted. 1. Increase the gain of the preamplifier so as to compensate for the attenuating effect caused by the sampling network. This solution involves an increase in the current consumption of the preamplifier. 2. Redesign the latches so as to obtain a lower input referred offset.

The preferred embodiment offset comparator shown in FIG. 3 significantly reduces the load seen by the previous stage amplifier. The settling time gained is an important contribution to the design of stage amplifiers in high speed ADCs. This leads to an overall improvement in power consumption in low power high speed pipelined ADCs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a preamplifier;
   a first capacitor coupled to a first input of the preamplifier;
   a second capacitor coupled to the first input of the preamplifier;
   a first switch coupled to the second capacitor;
   a third capacitor coupled to a second input of the preamplifier;
   a fourth capacitor coupled to the second input of the preamplifier;
   a second switch coupled to the fourth capacitor;
   a third switch coupled between the second and fourth capacitors; and
   a previous stage amplifier wherein the first capacitor is coupled between a first output of the previous stage amplifier and the first input of the preamplifier, and the third capacitor is coupled between a second output of the previous stage amplifier and the second input of the preamplifier.

2. The circuit of claim 1 further comprising:
   a fourth switch coupled between the first input of the preamplifier and a first output of the preamplifier; and
   a fifth switch coupled between the second input of the preamplifier and a second output of the preamplifier.

3. The circuit of claim 1 further comprising a latch coupled to an output of the preamplifier.

4. The circuit of claim 2 further comprising a latch coupled to the first and second outputs of the preamplifier.

5. The circuit of claim 1 further comprising a fourth switch coupled between the first output of the previous stage amplifier and the second output of the previous stage amplifier.

6. The circuit of claim 1 further comprising a first reference voltage coupled to the first switch, and a second reference voltage coupled to the second switch.

7. The circuit of claim 5 further comprising a first reference voltage coupled to the first switch, and a second reference voltage coupled to the second switch.

8. An offset compensated comparator comprising:
   an amplifier;
   a first capacitor having a first end coupled to a first input of the amplifier and a second end coupled to a first input node;
   a second capacitor having a first end coupled to the first input of the amplifier;
   a first switch having a first end coupled to a second end of the second capacitor;
   a third capacitor having a first end coupled to a second input of the amplifier and a second end coupled to a second input node;
   a fourth capacitor having a first end coupled to the second input of the amplifier;
   a second switch having a first end coupled to a second end of the fourth capacitor;
   a third switch coupled between the second end of the second capacitor and the second end of the fourth capacitor; and
   a fourth switch coupled between the second end of the first capacitor and the second end of the third capacitor.

9. The circuit of claim 8 further comprising:
   a fifth switch coupled between the first input of the amplifier and a first output of the amplifier; and
   a sixth switch coupled between the second input of the amplifier and a second output of the amplifier.

10. The circuit of claim 8 further comprising a latch coupled to an output of the amplifier.

11. The circuit of claim 9 further comprising a latch coupled to the first and second outputs of the amplifier.

12. The circuit of claim 8 further comprising a previous stage amplifier having a first output coupled to the first input node and a second output coupled to the second input node.

13. The circuit of claim 9 further comprising a previous stage amplifier having a first output coupled to the first input node and a second output coupled to the second input node.

14. The circuit of claim 8 further comprising a first reference voltage node coupled to a second end of the first switch, and a second reference voltage node coupled to a second end of the second switch.

15. The circuit of claim 9 further comprising a first reference voltage node coupled to a second end of the first switch, and a second reference voltage node coupled to a second end of the second switch.

16. The circuit of claim 12 further comprising a latch coupled to an output of the amplifier.

17. The circuit of claim 13 further comprising a latch coupled to the first and second outputs of the amplifier.

* * * * *